April 5, 1966 S. I. SLATER 3,244,947

SEMI-CONDUCTOR DIODE AND MANUFACTURE THEREOF

Filed June 15, 1962

INVENTOR.
SAUL I. SLATER

BY Darby + Darby

ATTORNEY

United States Patent Office 3,244,947
Patented Apr. 5, 1966

3,244,947
SEMI-CONDUCTOR DIODE AND MANUFACTURE THEREOF

Saul I. Slater, Glen Cove, N.Y., assignor to Slater Electric Inc., Glen Cove, N.Y., a corporation of New York Filed June 15, 1962, Ser. No. 202,892
7 Claims. (Cl. 317—234)

The present invention relates to semi-conductor diodes and methods of manufacturing such diodes.

More particularly still the invention relates to a semi-conductor diode assembly which renders the diode more readily manufactured with a lesser number of rejects than is currently possible while at the same time producing a diode rectifier having higher peak inverse voltage characteristics, particularly under low ambient pressure conditions, than has heretofore been possible.

The improvement in the properties of the diode rectifier of my present invention are in part due to the use of solid silver base and lead-in terminal connections in place of the steel or alloy material currently used, in part due to my discovery that the present method of gold plating the parts prior to etching leads to large numbers of rejects, and in part due to the construction of the housing in such a manner as to assure that heat generated at the diode junction be rapidly conducted to the housing thereby decreasing the operating temperature at the junction and providing for higher voltage ratings of the diode.

It is an object of the invention to provide a semi-conductor diode construction wherein heat generated at the junction is rapidly conducted away thereby assuring operation at lower temperature and therefore at higher voltage ratings.

It is another object of the invention to provide a method of construction of such a diode which lessens the numbers of rejects by eliminating the gold plating step normally utilized and thereby assuring that no minute particles of gold are deposited upon the periphery of the semiconductor wafer to thereby cause either complete or partial short circuiting of the rectifier.

It is still another object of this invention to provide a semi-conductor diode rectifier and housing assembly which is operable at low ambient pressures while producing a high peak inverse voltage rating.

Figure 1:
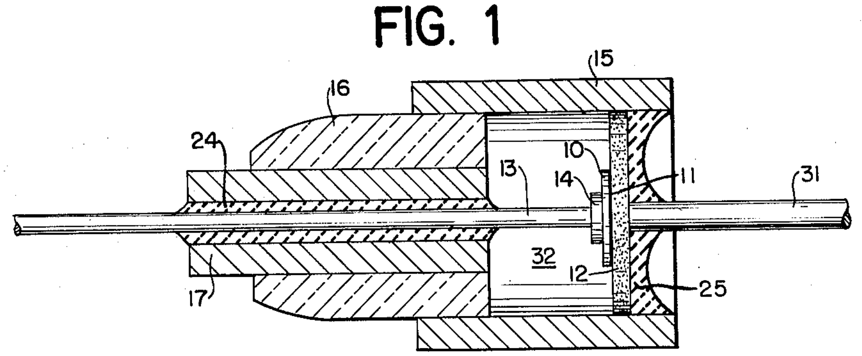
Figure 2:
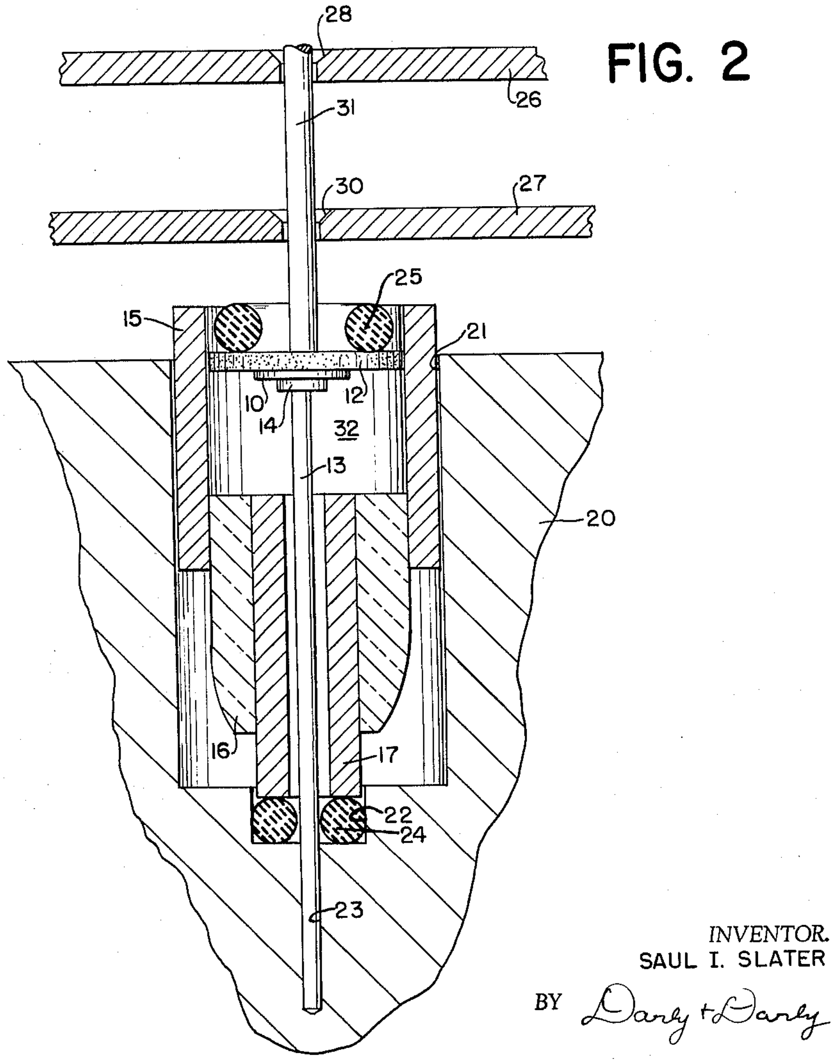

Other objects and features of the invention will be apparent when the following description is considered in connection with the annexed drawings, in which, FIGURE 1 is a transverse cross-sectional view of a semi-conductor diode in accordance with my invention; and FIGURE 2 is a fragmentary view of the elements of the diode rectifier in their position just prior to the performing of the assembly operation and sealing of the housing.

Referring now to the drawings, the diode rectifier comprises a wafer of semi-conductor material 10, in this instance silicon, to which is affixed, by means of solder 11, a silver base 12.

On the opposite side of the silicon wafer 10 is a silver conductor 13 having a head 14 formed integrally therewith, this head 14 being soldered to the silicon slice 10.

Prior to soldering the head 14 of conductor 13 and the silver base 11 to the silicon wafer 10, the silicon is coated with nickel in the usual manner and the nickel is sintered at approximately 850° C. Also, subsequent to the soldering operation the assembly is etched with a combination of acids comprising a mixture of five parts nitric acid, three parts hydrofluoric acid and three parts acetic acid by weight.

This etching operation is performed in order to assure that the peripheral edges of the silicon be completely smooth with no crevices or chips and be free of contaminants. Heretofore this etching operation has been performed after gold plating the metal parts, that is, the base and the lead-in conductor or nail 13, 14, this being done in order to protect the metal parts, gold being used since it is not attacked by the acid mixture mentioned.

I have found, however, that the use of this gold plate brings about a condition in which minute flecks of gold are in some manner freed from the surface and redeposited on the periphery of the silicon or other semi-conductor slice thereby forming partial or complete short circuits across the silicon and reducing or destroying the rectifier action. I have also discovered that by using pure silver in place of the usual steel or steel alloy base and in place of the usual tinned copper lead-in I can perform the etching step without the use of the gold plate. Although some of the silver is eaten away the silver is dissolved in the acid combination mentioned and no flecks or specks thereof are redeposited on the silicon and thus the short circuiting effects are avoided. No detrimental effects result from the omission of this gold plating step, the etching being satisfactorily performed and the amount of material etched away being so minute as to not be unduly costly.

Although I have set forth a hypotheses to account for the rejects, it is to be understood that whether this theory be correct or not the result of omission of the gold plating step and the use of silver in place of steel alloys results in a considerable lessening of the number of rejects and a generally improved operation of the diode rectifier. I believe that the reason for the detaching of minute particles of gold is that, although the gold itself is not attacked by the acid, the gold plating is thin and somewhat porous and therefore the acid etch attacks the metal under the gold. The solder, which is to some extent amalgamated with the gold, is apparently attacked and this causes the release of infinitesimal particles of gold which are dispersed in the solution. These particles then reattach themselves to the edge of the silicon and bring about the detrimental reverse leakage characteristics mentioned. Even though a subsequent water wash is utilized these gold particles are not removed.

It should be noted that although as stated some of the silver is attacked by the etching acid the resulting silver salts are readily washed away by water and there is no redeposit and retention of metal particles on the edges of the silicon slice.

In addition to the improved results obtained through the omission of the gold plating step as discussed above, the use of the solid silver base provides for a higher heat conductivity from the junction between the silicon and the base and the outer housing. In present practice, the commonly used base is of steel or of a steel alloy such as Kovar or Driver-Harris No. 52 alloy. All of these materials have heat conductivity which is very low relative to the heat conductivity of solid silver and therefore do not conduct the heat to the housing for dispersion in as satisfactory a manner. Additionally, these materials are normally welded to the housing which welding operation is difficult and expensive and frequently provides a low heat conductivity portion of the path from the silicon junction to the outer housing.

As seen in FIGURE 1, the parts heretofore described are assembled into a housing which comprises the steel cylinder 15, the glass cylinder 16 and the interior steel sleeve 17 which surrounds the silver lead-in 13. The glass-to-metal seals between the steel parts 15 and 17 and the glass 16 are made in the usual manner.

The assembly of the silicon wafer 10, silver base 12 and lead-in nail 13, 14 into the housing just above described is preferably performed by use of the vacuum sealing procedure described in detail in my Patent No.

2,710,713, issued June 14, 1955. In general, the parts are assembled in a jig 20 which is preferably of material to which solder does not bond, as for example oxidized aluminum. This jig is provided with a bore 21 slightly larger than the exterior diameter of the cylinder 15. It is also provided with a small bore 22 which has a diameter slightly larger than the diameter of the steel sleeve 17, this bore being concentric with the larger bore 21.

Centrally of the bore 22 is a further small bore 23 in which the lead-in nail 13, 14 is positioned. As seen in FIGURE 2 the parts are assembled in the jig with a solder ring 24 placed in the bore 22 so that the end of sleeve 17 rests upon the solder ring. The assembly comprising the nail 13, 14, the silicon wafer 10 and silver base 12 are then positioned in the jig being supported by the small central bore 23. Thereafter a solder ring 25 is placed on the upper surface of the silver base 12 and an auxiliary jig comprising the two parts 26 and 27 is positioned above the jig 20 with the openings 28 and 30 of the parts 26 and 27 respectively in alignment and aligned with the axis of the assembly. The base lead-in conductor 31 which is of tinned copper is inserted through the openings 28 and 30 in the jig elements 26 and 27 respectively and rests upon the upper surface of the base 12.

As decribed in the patent above mentioned, the jigs are positioned in a bell jar which can then be evacuated and thereafter filled with nitrogen under pressure. By thus evacuating and filling, the interior of the assembly, that is, the space designated 32 in the drawings, is filled with nitrogen or any other desired gas under predetermined pressure. After the assembly or assemblies within the bell jar have been pressurized to the desired extent and while the pressure is maintained in the bell jar, the metal portions of the assembly are heated by high frequency heating or other heating methods thereby causing the solder rings to melt. The lower ring is of such a size that substantially the entire amount of solder therein is caused by capillary action to flow upwardly between the sleeve 17 and the nail 13, 14 thereby bonding these parts together and of course sealing the housing against egress of gas from the chamber 32 during operation. The upper solder ring melts and forms a layer of solder over the base 12 bonding the lead-in wire into its position on that base and flowing around the periphery of the base 12 and sealing the upper end of the chamber against egress of gas during operation.

In addition to forming a seal the molten solder of the ring 25 fills the space between the outer periphery of the base 12 and the inner wall of cylinder 15, thus assuring that heat generated at the juncture between the base and the silicon slice 10 is conducted to the steel cylinder 15 during operation. Since the base 12 and solder 25 have high coefficients of heat conduction the device will, in use, operate at a relatively low temperature as regards the junction between the base and the silicon wafer. In other words, the temperature differential between the junction and the housing will be small resulting in a higher rating for the unit than is the case with the common diode rectifier assembly wherein the base is of steel or an alloy having a relatively low coefficient of heat conduction.

Once the solder rings 24 and 25 have been melted, as stated above, the heat source is disconnected and the solder permitted to harden, being then in the form shown in FIGURE 1. As soon as the solder is hardened the pressure is removed from the interior of the bell jar and the completed device or devices removed after separating the portions of the bell jar.

As will be obvious, the device may be sealed while the bell jar is evacuated rather than pressurized if it is desirable that the chamber 32 be an evacuated rather than a pressurized chamber.

While I have described a preferred form of my invention it will be understood that other embodiments thereof are possible. Furthermore, although I have set forth my belief as to the reasons that the omission of the gold plating step is effective in reducing a number of rejects, it will be understood that whether that theory is correct or not, the elimination of this step is effective in so reducing the rejects. Additionally, it will be understood that although a preferred method of manufacture of the diode of my invention has been described, other methods of assembling the elements and sealing them in a housing are possible. I wish therefore to be limited not by the foregoing disclosure but solely by the claims granted to me.

What is claimed is:

1. A diode rectifier construction comprising, in combination, a wafer of semi-conductor material, a silver base soldered to said wafer on one side thereof, a silver lead-in conductor soldered to said wafer on the opposite side thereof, said wafer, silver base and silver lead being etched to free said wafer of contaminants and a container for said assembly of wafer, base and lead-in, said base forming a wall of said container and being soldered directly to a heat dissipating wall of said container whereby said semi-conductor wafer is maintained at substantially the temperature of said container.

2. A diode rectifier in accordance with claim 1 wherein said container comprises a tubular metallic member fitting about the outer periphery of said base at one end, said member being coaxial with said assembly, a tubular glass member fitting within the opposite end of said tubular metallic member and a tubular metallic sleeve fitting within said glass member, said glass member being sealed to said sleeve and said tubular metallic member, said base being soldered to the inner wall of said metallic member and said lead-in member being soldered to the inner wall of said sleeve.

3. A diode in accordance with claim 2 wherein said wafer and said base are circular and wherein said tubular metallic member, said tubular glass member and said sleeve are cylindrical.

4. A diode rectifier in accordance with claim 2 wherein a second lead-in conductor is provided, said second conductor being soldered to said base by said solder joining said base to said tubular metallic member.

5. A diode rectifier in accordance with claim 3 wherein a second lead-in conductor is provided, said second conductor being soldered to said base by said solder joining said base to said tubular metallic member.

6. A diode rectifier in accordance with claim 2 wherein said container is evacuated.

7. A diode rectifier in accordance with claim 3 wherein said container is filled with gas under pressure.

References Cited by the Examiner

UNITED STATES PATENTS

| | | | |
|---|---|---|---|
| 2,853,661 | 9/1958 | Houle et al. | 317—235 |
| 2,887,630 | 5/1959 | Nijland et al. | 317—235 |
| 2,898,668 | 8/1959 | Knott et al. | 29—25.3 |
| 2,939,204 | 6/1960 | Knott et al. | 29—25.3 |
| 2,982,892 | 5/1961 | Bender et al. | 317—235 |
| 2,986,678 | 5/1961 | Andres et al. | 317—234 |
| 3,065,390 | 11/1962 | Boswell et al. | 317—234 |
| 3,110,080 | 11/1963 | Boyer et al. | 29—25.3 |
| 3,110,849 | 11/1963 | Soltys | 317—234 |

JOHN W. HUCKERT, *Primary Examiner.*

JAMES D. KALLAM, *Examiner.*

R. F. POLLISACK, *Assistant Examiner.*